United States Patent
Chen

(10) Patent No.: US 11,656,299 B2
(45) Date of Patent: May 23, 2023

(54) NEAR MAGNETIC FIELD VARIATION DETECTION SYSTEM AND DETECTION METHOD THEREOF

(71) Applicant: National Central University, Taoyuan (TW)

(72) Inventor: Chien-Chih Chen, Taoyuan (TW)

(73) Assignee: NATIONAL CENTRAL UNIVERSITY, Taoyuan (TW)

( * ) Notice: Subject to any disclaimer, the term of this patent is extended or adjusted under 35 U.S.C. 154(b) by 617 days.

(21) Appl. No.: 16/668,646

(22) Filed: Oct. 30, 2019

(65) Prior Publication Data
US 2020/0249285 A1     Aug. 6, 2020

(30) Foreign Application Priority Data
Feb. 1, 2019 (TW) .................................. 108104269

(51) Int. Cl.
G01R 33/04 (2006.01)
G01R 33/09 (2006.01)
G01V 3/08 (2006.01)
G08G 1/042 (2006.01)

(52) U.S. Cl.
CPC ........... *G01R 33/091* (2013.01); *G01R 33/04* (2013.01); *G01V 3/087* (2013.01); *G08G 1/042* (2013.01)

(58) Field of Classification Search
CPC ....... G01R 33/091; G01R 33/04; G01V 3/087
See application file for complete search history.

(56) References Cited

U.S. PATENT DOCUMENTS

| 9,727,058 B2* | 8/2017 | Siebert | G05D 1/0261 |
| 11,132,900 B2* | 9/2021 | Bender | G08G 1/143 |
| 2013/0027028 A1* | 1/2013 | Hohe | G01D 5/145 |
| | | | 324/207.11 |

* cited by examiner

*Primary Examiner* — Reena Aurora
(74) *Attorney, Agent, or Firm* — Muncy, Geissler, Olds & Lowe, P.C.

(57) ABSTRACT

A near magnetic field variation detection method comprises following steps of: measuring magnetic field by a first magnetic field sensor and a second magnetic field sensor respectively; and calculating a magnetic field measurement difference, wherein the magnetic field measurement difference is (1) a magnitude of a difference of a first-magnetic-field-measurement measured by the first magnetic field sensor and a second-magnetic-field-measurement measured by the second magnetic field sensor, or (2) a magnitude of a difference of a first-magnetic-field-measurement-component measured by the first magnetic field sensor along a characteristic direction and a second-magnetic-field-measurement-component measured by the second magnetic field sensor along the characteristic direction; wherein a near magnetic field variation is occurred when (a) the magnetic field measurement difference is continuously greater than a characteristic-threshold within a characteristic-time-period, or (b) an average value of the magnetic field measurement difference is greater than a characteristic-average-threshold within a characteristic-average-time-period.

36 Claims, 15 Drawing Sheets

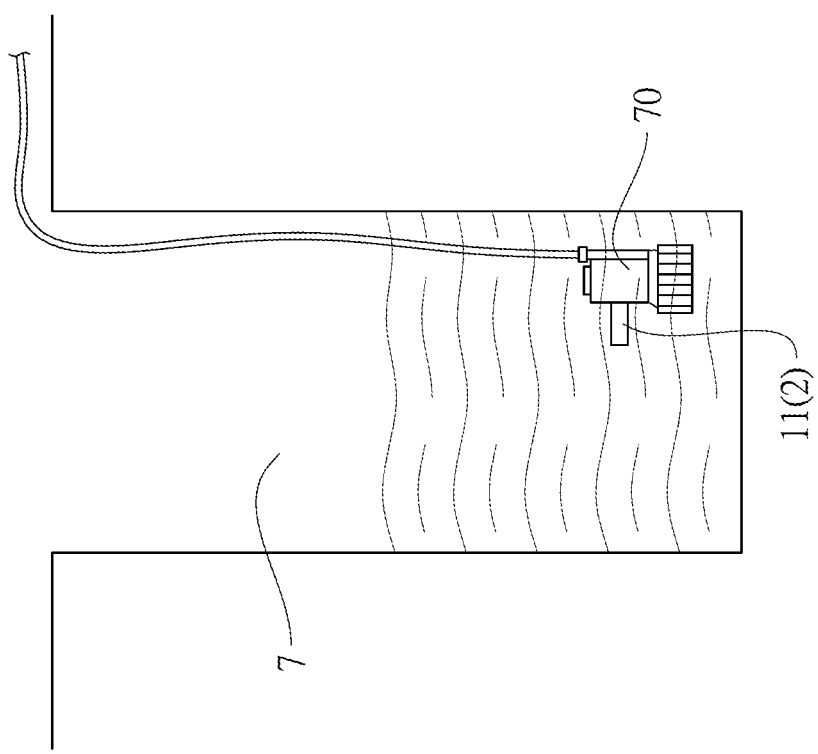

NEAR MAGNETIC FIELD VARIATION DETECTION SYSTEM AND DETECTION METHOD THEREOF

FIELD OF THE INVENTION

The present invention is related to a near magnetic field variation detection system and detection method, especially a near magnetic field variation detection system and detection method using two magnetic field sensors.

BACKGROUND OF THE INVENTION

The conventional technology uses a single magnetic field sensor to detect whether there is a car parking in the parking grid. Some variation of the magnetic field may occur as the vehicle passes through the parking grid or the vehicle enters and exits the parking grid. However, the biggest problem of conventional technology is that it cannot judge the following various conditions: 1. Is the variation of the magnetic field caused by the passing of the car near the parking grid? 2. Is the variation of the magnetic field caused by other cars passing by the parking grid when there is a car parked in the parking grid? 3. Is the variation of the magnetic field caused by the local geomagnetic field variation with time when there is a car parked in the parking grid? Since by the magnetic field measured by a single magnetic field sensor is impossible to tell whether the source of the variation of the magnetic field is caused by a car parked in the parking grid, or is caused by a car passing or parked outside the parking grid, or is caused by a car parked in the parking grid and another car passing or parked outside the parking grid. Or the variation of the geomagnetic field is also a factor of the variation of the magnetic field. Therefore, it is impossible to accurately determine whether there is a car parked in a parking grid by the conventional technology which only uses a single magnetic field sensor to measure magnetic field. Hence, it often misjudges. Since the single magnetic field sensor of conventional technology is buried under the ground of the parking grid, the most important problem faced by conventional technology is that it is impossible to accurately determine whether the source of the variation of the magnetic field measured by a single magnetic field sensor is near the magnetic field sensor (that is, in the parking grid, but not outside the parking grid or the variation of geomagnetic field).

Accordingly, the present invention has developed a new design which may avoid the above-described drawbacks, may significantly enhance the performance of the devices and may take into account economic considerations. Therefore, the present invention then has been invented.

SUMMARY OF THE INVENTION

The main technical problem that the present invention is seeking to solve is how to eliminate the interference of the object not near around and the variation of the geomagnetic field, so as to accurately determine whether there is a near object causing the variation of the magnetic field.

In order to solve the above-described problems and to achieve the expected effect, the present invention provides a near magnetic field variation detection method, wherein a magnetic field sensor set is disposed in a detecting area or a peripheral area of the detecting area, the magnetic field sensor set includes a first magnetic field sensor and a second magnetic field sensor, the method comprises following steps of: measuring magnetic field by the first magnetic field sensor and the second magnetic field sensor respectively; and calculating a magnetic field measurement difference, wherein the magnetic field measurement difference is (1) a magnitude of a difference of a first magnetic field measurement (vector) measured by the first magnetic field sensor and a second magnetic field measurement (vector) measured by the second magnetic field sensor, or (2) a magnitude of a difference of a first magnetic field measurement component measured by the first magnetic field sensor along a characteristic direction and a second magnetic field measurement component measured by the second magnetic field sensor along the characteristic direction; wherein a near magnetic field variation is occurred when (a) the magnetic field measurement difference is continuously greater than a characteristic threshold within a characteristic time period, or (b) an average value of the magnetic field measurement difference is greater than a characteristic average threshold within a characteristic average time period.

Furthermore, the present invention further provides a near magnetic field variation detection system which comprises a magnetic field sensor set and a data processing unit. The magnetic field sensor set is disposed in a detecting area or a peripheral area of the detecting area. The magnetic field sensor set comprises a first magnetic field sensor and a second magnetic field sensor. The data processing unit is connected to the magnetic field sensor set in a wired or wireless manner, wherein a magnetic field measurement difference is calculated by the data processing unit, wherein the magnetic field measurement difference is (1) a magnitude of a difference of a first magnetic field measurement (vector) measured by the first magnetic field sensor and a second magnetic field measurement (vector) measured by the second magnetic field sensor, or (2) a magnitude of a difference of a first magnetic field measurement component measured by the first magnetic field sensor along a characteristic direction and a second magnetic field measurement component measured by the second magnetic field sensor along the characteristic direction; wherein a near magnetic field variation is occurred when (a) the magnetic field measurement difference is continuously greater than a characteristic threshold within a characteristic time period, or (b) an average value of the magnetic field measurement difference is greater than a characteristic average threshold within a characteristic average time period.

In an embodiment, the near magnetic field variation is caused as an object enters the detecting area.

In an embodiment, the detecting area is a moveable apparatus parking place, the object is a moveable apparatus, wherein by detecting the near magnetic field variation to determine if the moveable apparatus is parked in the moveable apparatus parking place.

In an embodiment, the moveable apparatus is a transportation vehicle, wherein the transportation vehicle is a land vehicle, a sea vehicle, a flight vehicle, a tram, a cable car, or a railed vehicle.

In an embodiment, the moveable apparatus parking place has a moveable apparatus entrance, wherein the magnetic field sensor set is disposed non-adjacent to the moveable apparatus entrance.

In an embodiment, the detecting area is an interval of a vehicle running route, the object is a transportation vehicle, wherein by detecting a number of times the near magnetic field variation occurred to determine a traffic flow within the interval of the vehicle running route.

In an embodiment, the object includes at least one metallic material.

In an embodiment, the near magnetic field variation is caused as a motor starts or stops operating in the detecting area.

In an embodiment, the detecting area is a well, an exploratory well or an oil well.

In an embodiment, the peripheral area includes the above, the under, and the surrounding of the detecting area.

In an embodiment, the characteristic direction is approximately pointing to the detecting area.

In an embodiment, the characteristic direction is approximately parallel to a geomagnetic inclination direction of the location of the detecting area.

In an embodiment, the characteristic direction is approximately parallel to a geomagnetic declination direction of the location of the detecting area.

In an embodiment, a first distance between the first magnetic field sensor and the detecting area is not equal to a second distance between the second magnetic field sensor and the detecting area.

In an embodiment, a first distance between the first magnetic field sensor and the detecting area is greater than or equal to a sensor relative distance between the first magnetic field sensor and the second magnetic field sensor.

In an embodiment, a second distance between the second magnetic field sensor and the detecting area is greater than or equal to the sensor relative distance.

In an embodiment, the first distance is not equal to the second distance.

In an embodiment, a direction of a line determined by the first magnetic field sensor and the second magnetic field sensor is approximately parallel to the characteristic direction.

In an embodiment, a direction of a line determined by the first magnetic field sensor and the second magnetic field sensor is approximately pointing to the detecting area.

For further understanding the characteristics and effects of the present invention, some preferred embodiments referred to drawings are in detail described as follows.

BRIEF DESCRIPTION OF DRAWINGS

FIG. 7 is a cross-sectional schematic view of an embodiment of a near magnetic field variation detection system and detection method of the present invention.

DETAILED DESCRIPTIONS OF DETAILED EMBODIMENTS

Figure 1B:
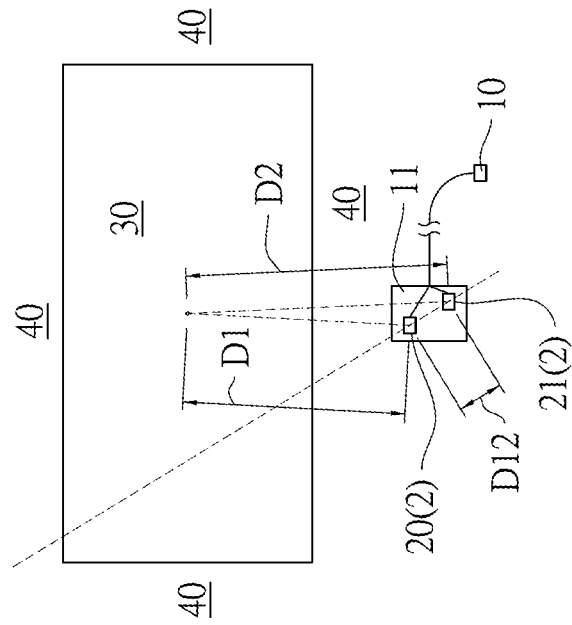
FIG. 1B is a cross-sectional schematic view of FIG. 1A.
Figure 1A:
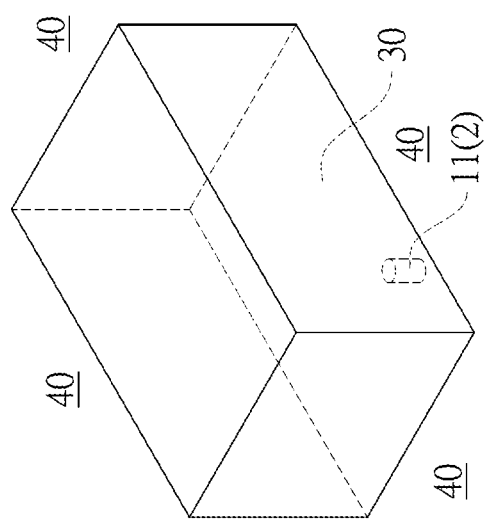
FIG. 1A is a schematic perspective view showing an embodiment of a near magnetic field variation detection system and detection method of the present invention.
Figure 1D:
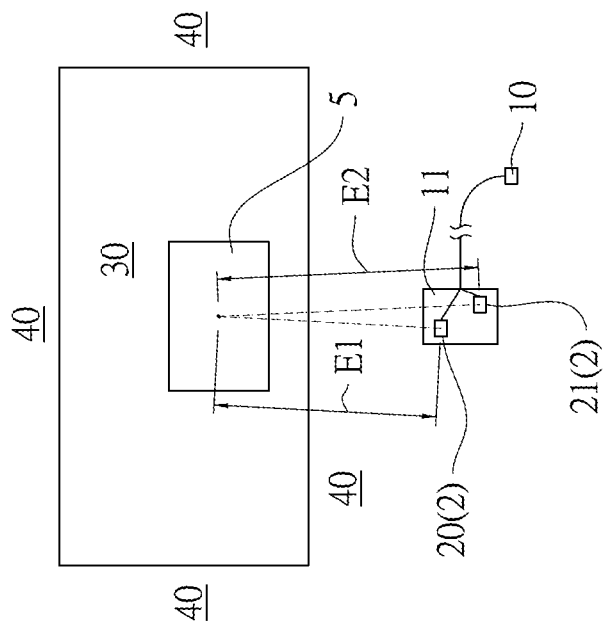
FIGS. 1C and 1D are cross-sectional schematic views of embodiments of a near magnetic field variation detection system and detection method of the present invention.
Figure 1C:
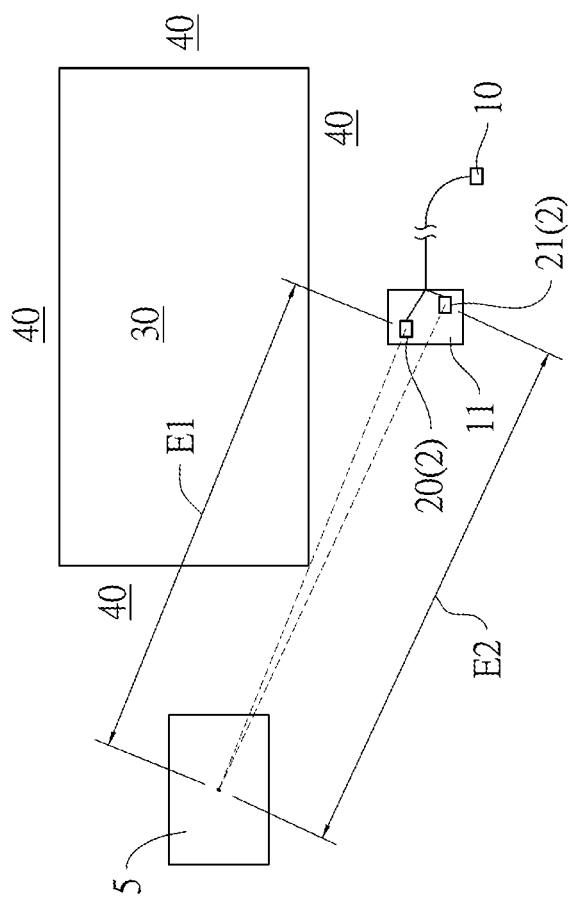

Please refer to FIG. 1A, which is a schematic perspective view showing an embodiment of a near magnetic field variation detection system and detection method of the present invention. Please also refer to FIG. 1B, which is a cross-sectional schematic view of FIG. 1A. The near magnetic field variation detection system of the present invention comprises a magnetic field sensor set 2 and a data processing unit 10. In current embodiment, the magnetic field sensor set 2 is configured in a detecting module 11, wherein the detecting module 11 (the magnetic field sensor set 2) is disposed in a peripheral area 40 of a detecting area 30, wherein the peripheral area 40 includes any location of the above, the under and the surrounding of the detecting area 30. The magnetic field sensor set 2 comprises a first magnetic field sensor 20 and a second magnetic field sensor 21. The data processing unit 10 is not configured in the detecting module 11. In current embodiment, the magnetic field sensor set 2 is connected to the data processing unit 10 in a wired manner; the second magnetic field sensor 21 is disposed near the bottom of the first magnetic field sensor 20 (not right under the first magnetic field sensor 20). A first distance D1 between the first magnetic field sensor 20 and the detecting area 30 is smaller than a second distance D2 between the second magnetic field sensor 21 and detecting area 30, and the first distance D1 between the first magnetic field sensor 20 and the detecting area 30 is greater than a sensor relative distance D12 between the first magnetic field sensor 20 and the second magnetic field sensor 21, and the second distance D2 between the second magnetic field sensor 21 and detecting area 30 is greater than the sensor relative distance D12 between the first magnetic field sensor 20 and the second magnetic field sensor 21. A direction V of a line determined by the first magnetic field sensor 20 and the second magnetic field sensor 21 is approximately pointing to the detecting area 30. The near magnetic field variation detection method of the present invention comprises following steps of: Step A1: measuring magnetic field by the first magnetic field sensor 20 and the second magnetic field sensor 21 respectively; and Step A2: calculating a magnetic field measurement difference by the data processing unit 10, wherein the magnetic field measurement difference is (1) a magnitude of a difference of a first magnetic field measurement (vector) measured by the first magnetic field sensor 20 and a second magnetic field measurement (vector) measured by the second magnetic field sensor 21, or (2) a magnitude of a difference of a first magnetic field measurement component measured by the first magnetic field sensor 20 along a characteristic direction and a second magnetic field measurement component measured by the second magnetic field sensor 21 along the characteristic direction; wherein a near magnetic field variation is occurred when (a) the magnetic field measurement difference is continuously greater than a characteristic threshold within a characteristic time period, or (b) an average value of the magnetic field measurement difference is greater than a characteristic average threshold within a characteristic average time period. There are two main types of reasons causing the near magnetic field variation: the first type: the near magnetic field variation is caused as an object enters (or leaves) the detecting area 30; the second type: the near magnetic field variation is caused as a motor in the detecting area 30 starts (or stops) operating. In current embodiment, the reason causing the near magnetic field variation belongs to the first type. When the characteristic direction is selected, only the variations of the first magnetic field measurement component measured by the first magnetic field sensor 20 along the characteristic direction and the second magnetic field measurement component measured by the second magnetic field sensor 21 along the characteristic direction are concerned. The characteristic direction may be selected to be approximately parallel to the direction V of the line determined by the first magnetic field sensor 20 and the second magnetic field sensor 21, or approximately pointing to the detecting area 30, or approximately parallel to a geomagnetic inclination direction of the location of the detecting area 30, or approximately parallel to a geomagnetic declination direction of the location of the detecting area 30. Surely the characteristic direction may be selected in other directions. For example, the first magnetic field sensor 20 and the second magnetic field sensor 21 are disposed such that a Z-axis direction of the first magnetic field sensor 20 is parallel to a Z-axis direction of the second magnetic field sensor 21, and then the characteristic direction may be selected to be the Z-axis direction of the first magnetic field sensor 20 (that is the Z-axis direction of the second magnetic field sensor 21). In this way, after measuring magnetic field by the first magnetic field sensor 20 and the second magnetic field sensor 21, to calculate the magnetic field measurement difference is simply to calculate the magnitude of the difference of the first magnetic field measurement component measured by the first magnetic field sensor 20 along the Z-axis direction and the second magnetic field measurement component measured by the second magnetic field sensor 21 along the Z-axis direction. It is no need to calculate a measurement component measured by the first magnetic field sensor 20 along an X-axis or a Y-axis direction of the first magnetic field sensor 20 or a measurement component measured by the second magnetic field sensor 21 along a X-axis or a Y-axis direction of the second magnetic field sensor 21. As a result, it is faster in actual calculation. Please also refer to FIGS. 1C and 1D, which are cross-sectional schematic views of embodiments of a near magnetic field variation detection system and detection method of the present invention. In the embodiment of FIG. 1C, a variation of magnetic field is occurred as an object 5 enters the peripheral area 40. At this time, the distance between the object 5 and the first magnetic field sensor 20 is a first object distance E1; the distance between the object 5 and the second magnetic field sensor 21 is a second object distance E2. The difference between the first object distance E1 and the second object distance E2 is an object distance difference E12. However, the first object distance E1 is much larger than the object distance difference E12 (that is, the second object distance E2 is also much larger than the object distance difference E12), hence, for the first magnetic field sensor 20 and the second magnetic field sensor 21, the variation of magnetic field induced by the object 5 belongs to the long distance magnetic field variation. Therefore, the variation of magnetic field induced by the object 5 measured by the first magnetic field sensor 20 is very closed to the variation of magnetic field induced by the object 5 measured by the second magnetic field sensor 21 (almost the same). For example, in the case of a magnetic dipole, the magnetic field intensity is inversely proportional to the cube of the distance. That is to say, if the distances between two magnetic field sensors and the magnetic dipoles are respectively F1 and F2, and the difference of the distances between the two magnetic field sensors and the magnetic dipole is F12, then using the two magnetic field sensors to measure magnetic field respectively, the results are: $K/F1^3$ and $K/F2^3$, wherein K is a value, wherein $K/F2^3 = K/(F1-F12)^3$. Calculate the difference of $K/F1^3$ and $K/F2^3$, the result is:

$$K/F1^3 - K/F2^3 = K/F1^3 - K/(F1-F12)^3 =$$

$$\frac{K \times (-3 \times F1^2 \times F12 + 3 \times F1 \times F12^2 - F12^3)}{F1^3 \times (F1^3 - 3 \times F1^2 \times F12 + 3 \times F1 \times F12^2 - F12^3)}$$

However, F1 is much larger than F12, hence, the difference of $K/F1^3$ and $K/F2^3$ is approaching zero. In fact, in the embodiment of FIG. 1C, the object 5 is not a magnetic dipole, however, for the first magnetic field sensor 20 or the second magnetic field sensor 21, the variation of magnetic field induced by the object 5 belongs to the long distance magnetic field variation. Hence, the variation of magnetic field induced by the object 5 measured by the first magnetic field sensor 20 is very closed to the variation of magnetic field induced by the object 5 measured by the second magnetic field sensor 21. In the embodiment of FIG. 1D, since the object 5 enters detecting area 30, the first object distance E1 is not much larger than the object distance difference E12, and the second object distance E2 is not much larger than the object distance difference E12. Therefore, for the first magnetic field sensor 20 and the second magnetic field sensor 21, the variation of magnetic field induced by the object 5 belongs to the short distance magnetic field variation (near magnetic field variation). Therefore, the variation of magnetic field induced by the object 5 measured by the first magnetic field sensor 20 is different from (not nearly the same) the variation of magnetic field induced by the object 5 measured by the second magnetic field sensor 21. Therefore, a near magnetic field variation detection system and detection method of the present invention, by subtracting the magnetic field measurements measured by the first magnetic field sensor 20 and the second magnetic field sensor 21 (or the components along the characteristic direction) to remove the influence of the long distance magnetic field variation to determine whether a near magnetic field variation is occurred, wherein also the influence of the local geomagnetic field variation with time has been removed. This is not possible with conventional techniques that use only a single magnetic field sensor for measurement.

In some embodiments, the object 5 includes at least one metallic material.

Figure 2A:
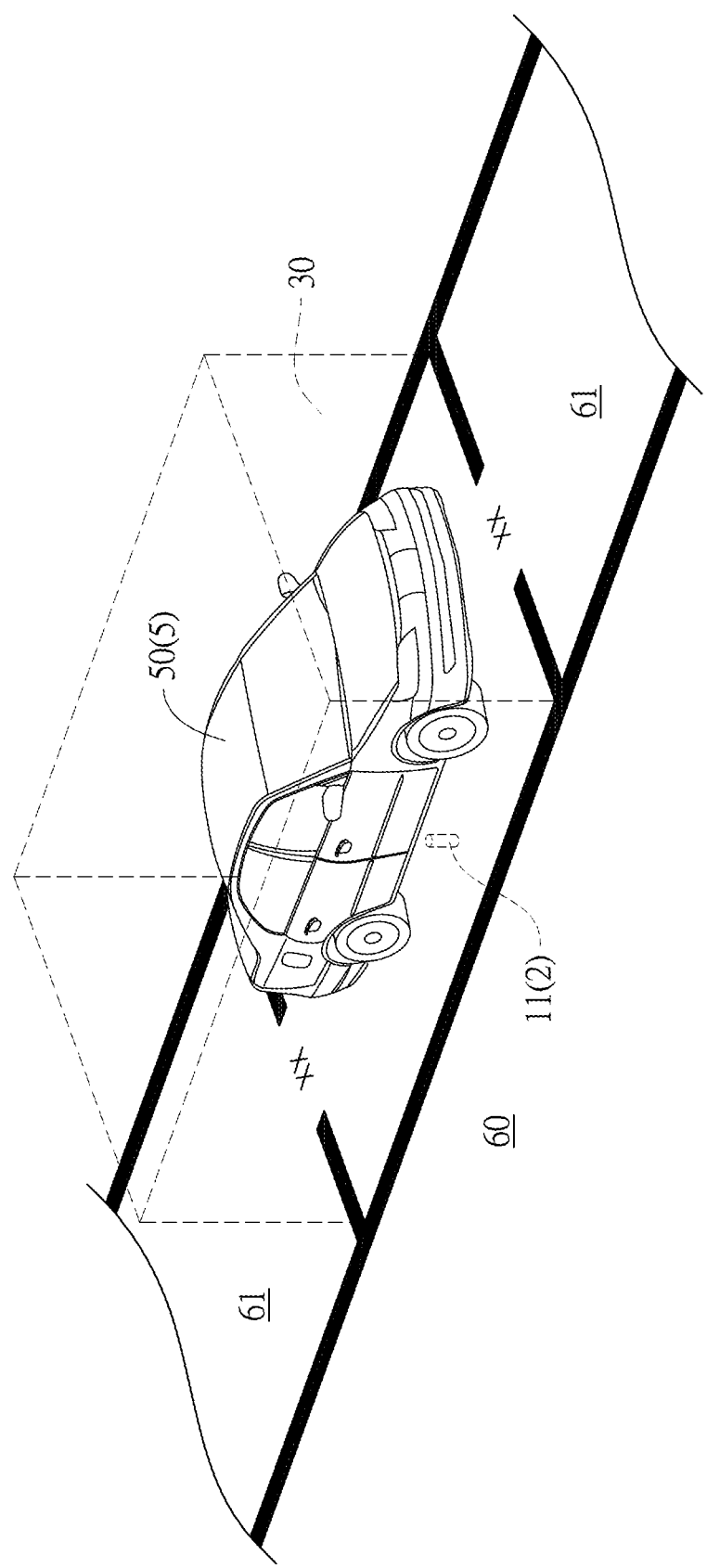
FIG. 2A is a schematic perspective view showing another embodiment of a near magnetic field variation detection system and detection method of the present invention.
Figure 2C:
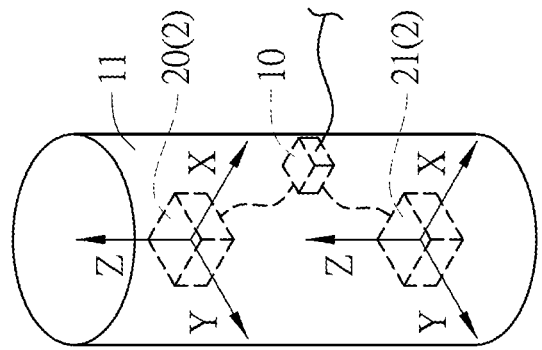
FIG. 2C is a schematic perspective view showing an embodiment of a near magnetic field variation detection system of the present invention.
Figure 2B:
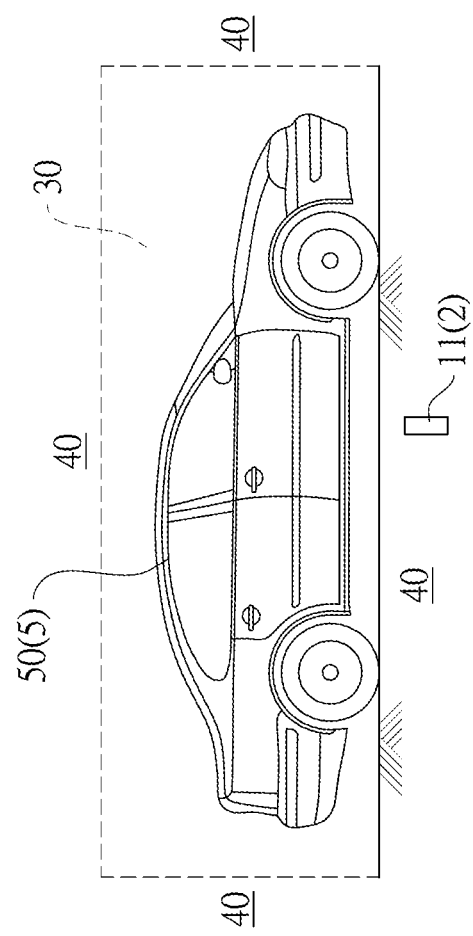
FIG. 2B is a cross-sectional schematic view of FIG. 2A.
Figure 2D:
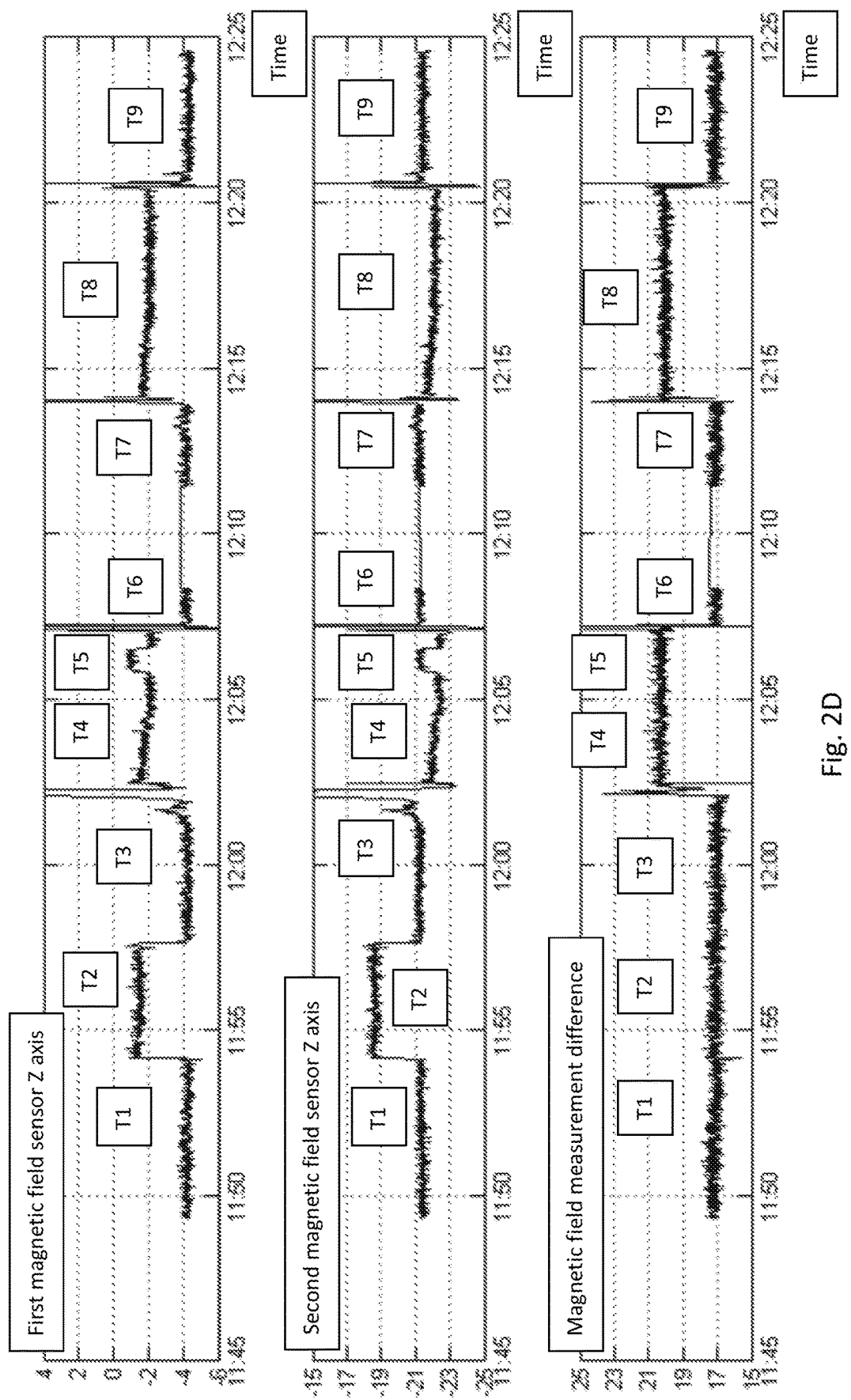
FIG. 2D shows magnetic field measurement component diagrams and difference of magnetic field measurement component diagram of an embodiment of a near magnetic field variation detection system and detection method of the present invention.
Figure 2E:
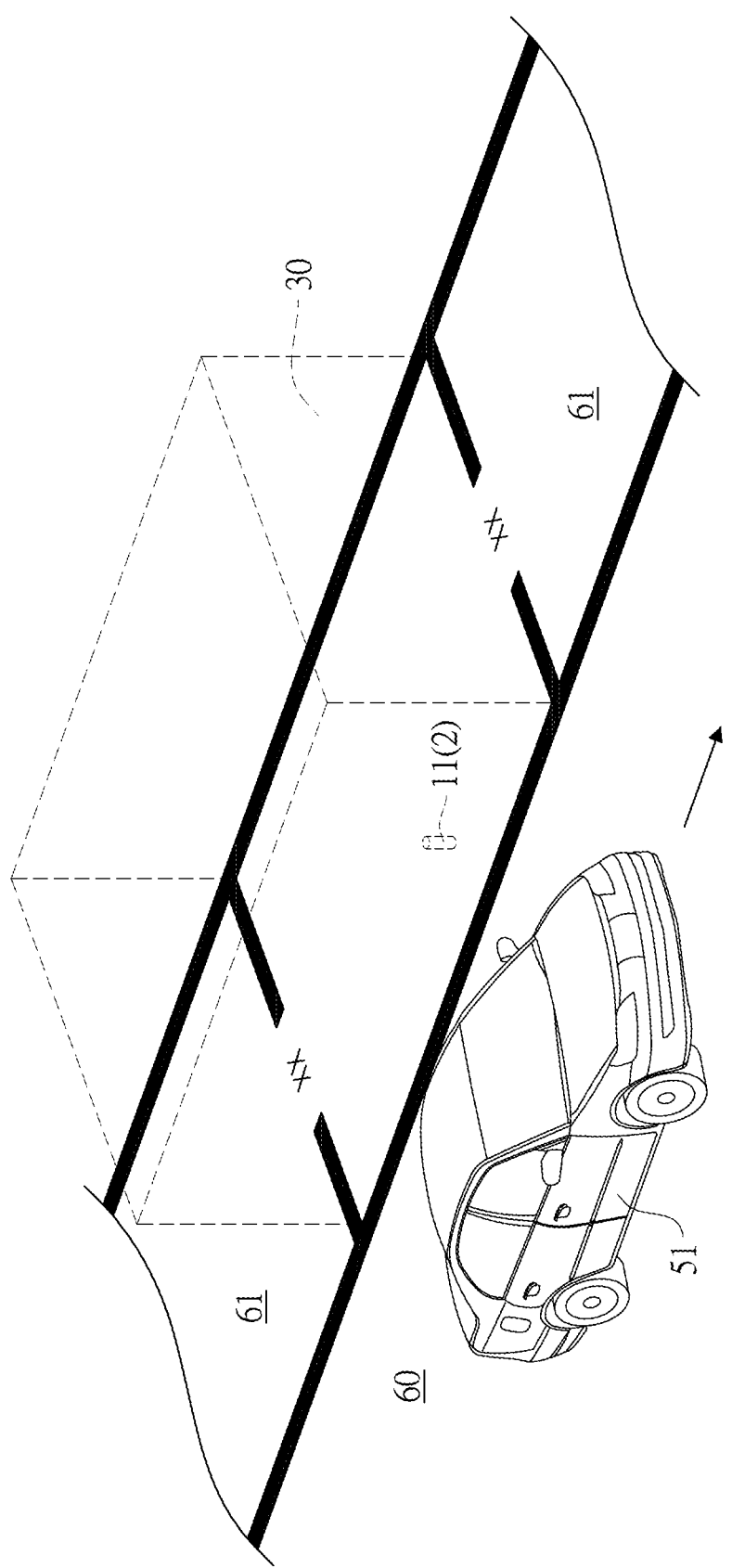
FIG. 2E is a schematic perspective view showing an embodiment of a near magnetic field variation detection system and detection method of the present invention.

Please refer to FIG. 2A, which is a schematic perspective view showing another embodiment of a near magnetic field variation detection system and detection method of the present invention. Please also refer to FIG. 2B, which is a cross-sectional schematic view of FIG. 2A. Also please refer to FIG. 2C, which is a schematic perspective view showing an embodiment of a near magnetic field variation detection system of the present invention. The a near magnetic field variation detection system of the present invention comprises a magnetic field sensor set 2 and a data processing unit 10. In current embodiment, the magnetic field sensor set 2 and the data processing unit 10 are both configured in a detecting module 11, wherein the detecting module 11 (including magnetic field sensor set 2 and the data processing unit 10) is disposed in a peripheral area 40 of a detecting area 30, wherein the peripheral area 40 includes any location of the above, the under, and the surrounding of the detecting area 30. In current embodiment, the detecting area 30 is a parking grid; the object 5 is a vehicle 50; wherein the detecting module 11 (including magnetic field sensor set 2 and the data processing unit 10) is disposed under the ground of the parking grid. The magnetic field sensor set 2 comprises a first magnetic field sensor 20 and a second magnetic field sensor 21. In current embodiment, the magnetic field sensor set 2 is connected to the data processing unit 10 in a wired manner; the second magnetic field sensor 21 is disposed under the first magnetic field sensor 20; wherein a first distance between the first magnetic field sensor 20 and the detecting area 30 is smaller than a second distance between the second magnetic field sensor 21 and detecting area 30 (because the second magnetic field sensor 21 is disposed under the first magnetic field sensor 20), and the first distance between the first magnetic field sensor 20 and the detecting area 30 is greater than a sensor relative distance between the first magnetic field sensor 20 and the second magnetic field sensor 21, and the second distance between the second magnetic field sensor 21 and detecting area 30 is greater than the sensor relative distance between the first magnetic field sensor 20 and the second magnetic field sensor 21; wherein a Z-axis direction of the first magnetic field sensor 20 is upward; a Z-axis direction of the second magnetic field sensor 21 is also upward. In current embodiment, the near magnetic field variation detection method of the present invention comprises following steps of: Step A1: measuring magnetic field by the first magnetic field sensor 20 and the second magnetic field sensor 21 respectively; Please also refer to FIG. 2D, which shows magnetic field measurement component diagrams and difference of magnetic field measurement component diagram of an embodiment of a near magnetic field variation detection system and detection method of the present invention. The upper diagram of FIG. 2D is the first magnetic field measurement component diagram measured by the first magnetic field sensor 20 along the Z-axis direction. The middle diagram of FIG. 2D is the second magnetic field measurement component diagram measured by the second magnetic field sensor 21 along the Z-axis direction; and Step A2: calculating a magnetic field measurement difference by the data processing unit 10, wherein the magnetic field measurement difference is a magnitude of a difference of a first magnetic field measurement component measured by the first magnetic field sensor 20 along a characteristic direction (in current embodiment, the characteristic direction is the Z-axis direction) and a second magnetic field measurement component measured by the second magnetic field sensor 21 along the characteristic direction; wherein a near magnetic field variation is occurred when (a) the magnetic field measurement difference is continuously greater than a characteristic threshold within a characteristic time period, or (b) an average value of the magnetic field measurement difference is greater than a characteristic average threshold within a characteristic average time period. The lower diagram of FIG. 2D is the difference of the magnetic field measurement component diagram, that is the magnitude of the difference of the first magnetic field measurement component measured by the first magnetic field sensor 20 along the Z-axis direction and the second magnetic field measurement component measured by the second magnetic field sensor 21 along the Z-axis direction. That is the magnitude of the difference of the upper diagram of FIG. 2D and the middle diagram of FIG. 2D. In current embodiment, a direction of the line determined by the first magnetic field sensor 20 and the second magnetic field sensor 21 is parallel to the characteristic direction (the Z-axis direction), and is pointing to the detecting area 30. In FIG. 2D, the time axis is divided into a T1 time period to a T9 time period (a total of nine time periods). During the T1 time period, there is no vehicle parked or passing through the detecting area 30, a first peripheral area 60 and a second peripheral area 61. During the T2 time period (please also refer to FIG. 2E, which is a schematic perspective view showing an embodiment of a near magnetic field variation detection system and detection method of the present invention), there is a vehicle 50 (object 5) passing through the first peripheral area 60. During the T3 time period, since the vehicle 50 had passed through the first peripheral area 60, then the state is back to the state that there is no vehicle parked or passing through the detecting area 30, the first peripheral area 60 and the second peripheral area 61. During the first magnetic field sensor 20 and the second magnetic field sensor 21 measuring magnetic field, when the vehicle 50 passing through the first peripheral area 60 or parked in the second peripheral area 61, the first magnetic field sensor 20 and the second magnetic field sensor 21 can measure the variation of magnetic field respectively. For example, between the T1 time period and the T2 time period in FIG. 2D, the vehicle 50 starts passing through the first peripheral area 60. The first magnetic field measurement component measured by the first magnetic field sensor 20 along the Z-axis direction varies from about −4 to about −1.5; while the second magnetic field measurement component measured by the second magnetic field sensor 21 along the Z-axis direction varies from about −21 to about −18.5. The first peripheral area 60 and the second peripheral area 61 are far away from the first magnetic field sensor 20 and the second magnetic field sensor 21, therefore, the variation of magnetic field induced by the vehicle 50 belongs to the long distance magnetic field variation for the first magnetic field sensor 20 and the second magnetic field sensor 21. Therefore, as the above-described embodiment, when the vehicle 50 passing through the first peripheral area 60, a variation of the first magnetic field measurement measured by the first magnetic field sensor 20 and a variation of the second magnetic field measurement measured by the second magnetic field sensor 21 are almost the same. The result can be observed by the actual measurement and the result of calculation (as shown in the difference of the magnetic field measurement component diagram of the lower diagram of FIG. 2D). In the lower diagram of FIG. 2D, the values are almost around the same value, during the T1, T2, and T3 time periods. During the T2 time period, the difference of the magnetic field measurement component almost not varies as the vehicle 50 passing through the first peripheral area 60.

Figure 2F:
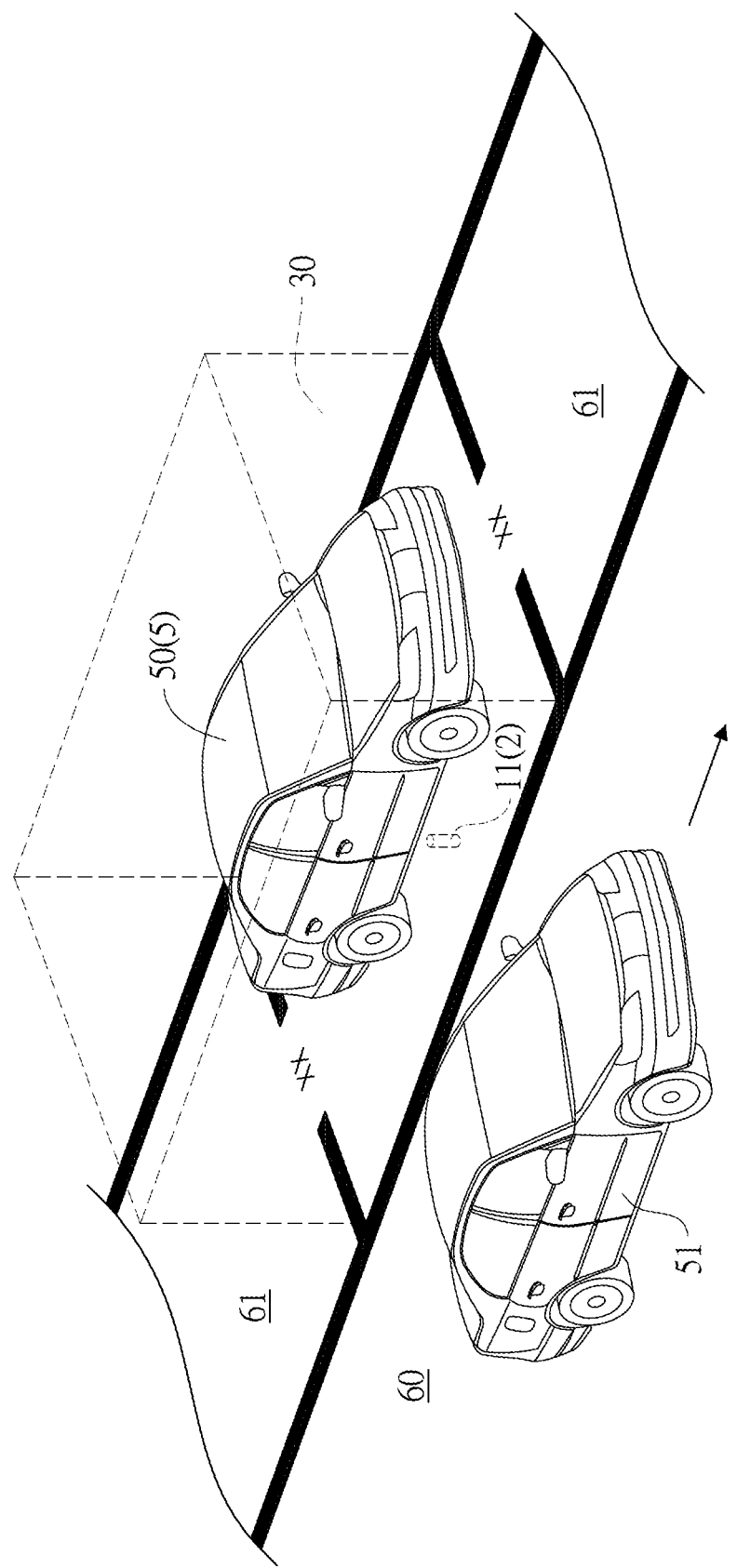
FIG. 2F is a schematic perspective view showing an embodiment of a near magnetic field variation detection system and detection method of the present invention.

During the T4 time period (Please refer to FIG. 2A), the vehicle 50 (the object 5) is parked in the detecting area 30 (parking grid). There are some disturbance fluctuations between the T3 time period and the T4 time period. The disturbance fluctuations are caused during the vehicle 50 starting entering the detecting area 30 for parking. Between the T3 time period and the T4 time period in FIG. 2D, the first magnetic field measurement component measured by the first magnetic field sensor 20 along the Z-axis direction varies from about −4 to about −2; while the second magnetic field measurement component measured by the second magnetic field sensor 21 along the Z-axis direction varies from about −21 to about −22. The detecting area 30 is closer to (compare to the distance from the first peripheral area 60 and the second peripheral area 61 to the first magnetic field sensor 20 and the second magnetic field sensor 21) the first magnetic field sensor 20 and the second magnetic field sensor 21, therefore, the variation of magnetic field induced by the vehicle 50 parked in the detecting area 30 belongs to the short distance magnetic field variation (near magnetic field variation) for the first magnetic field sensor 20 and the second magnetic field sensor 21. Therefore, as the above-described embodiment, when the vehicle 50 is parked in the detecting area 30, a variation of the first magnetic field measurement measured by the first magnetic field sensor 20 is different from (not nearly the same) a variation of the second magnetic field measurement measured by the second magnetic field sensor 21. The result can be observed by the actual measurement and the result of calculation (as shown in the difference of the magnetic field measurement component diagram of the lower diagram of FIG. 2D). The difference of the magnetic field measurement component within the T4 time period is obviously greater than the difference of the magnetic field measurement component within the T3 time period and with the T5 time period. Therefore, the near magnetic field variation detection method of the present invention can easily detect a near magnetic field variation is occurred during the T4 time period. That is there is the object 5 (the vehicle 50) entered into the detecting area 30 (parking grid) and stayed for a certain time period. During the T5 time period (please also refer to FIG. 2F, which is a schematic perspective view showing an embodiment of a near magnetic field variation detection system and detection method of the present invention), another vehicle 51 is passing through the first peripheral area 60 when the vehicle 50 (the object 5) is parked in the detecting area 30 (parking grid). The first magnetic field sensor 20 and the second magnetic field sensor 21 can measure the variation of magnetic field respectively when the vehicle 51 is passing through the first peripheral area 60. Between the T4 time period and the T5 time period in FIG. 2D, the first magnetic field measurement component measured by the first magnetic field sensor 20 along the Z-axis direction varies from about −2 to about −1; while the second magnetic field measurement component measured by the second magnetic field sensor 21 along the Z-axis direction varies from about −22.5 to about −21. However, the near magnetic field variation detection method of the present invention can easily eliminate interference caused by the vehicle 51 passing through the first peripheral area 60 during the T5 time period so as to accurately determine the vehicle 50 (the object 5) is still parked in the detecting area 30 (parking grid). The result can be observed by the actual measurement and the result of calculation (as shown in the difference of the magnetic field measurement component diagram of the lower diagram of FIG. 2D). The difference of the magnetic field measurement component during the T5 time period is almost the same as the difference of the magnetic field measurement component during the T4 time period. During the T6 time period, since the vehicle 50 has left the detecting area 30, then the state is back to the state that there is no vehicle parked or passing through the detecting area 30, the first peripheral area 60 and the second peripheral area 61. There are some disturbance fluctuations between the T5 time period and the T6 time period. The disturbance fluctuations are caused during the vehicle 50 is leaving the detecting area 30.

The same, during the T7 time period, there is no vehicle parked or passing through the detecting area 30, the first peripheral area 60 and the second peripheral area 61, wherein during both the T6 time period and the T7 time period, there is no vehicle parked or passing through the detecting area 30, the first peripheral area 60 and the second peripheral area 61. During the T8 time period (Please refer to FIG. 2A), the vehicle 50 (the object 5) is parked in the detecting area 30 (parking grid). There are some disturbance fluctuations between the T7 time period and the T8 time period. The disturbance fluctuations are caused during the vehicle 50 starting entering the detecting area 30 for parking. Between the T7 time period and the T8 time period in FIG. 2D, the first magnetic field measurement component measured by the first magnetic field sensor 20 along the Z-axis direction varies from about −4 to about −2; while the second magnetic field measurement component measured by the second magnetic field sensor 21 along the Z-axis direction varies from about −21 to about −21.5. Therefore, the near magnetic field variation detection method of the present invention can again easily detect a near magnetic field variation is occurred during the T8 time period. That is there is the object 5 (the vehicle 50) entered into the detecting area 30 (parking grid) and stayed for a certain time period. During the T9 time period, since the vehicle 50 has left the detecting area 30, then the state is back to the state that there is no vehicle parked or passing through the detecting area 30, the first peripheral area 60 and the second peripheral area 61. There are some disturbance fluctuations between the T8 time period and the T9 time period. The disturbance fluctuations are caused during the vehicle 50 is leaving the detecting area 30.

From the upper diagram of FIG. 2D (the first magnetic field measurement component diagram measured by the first magnetic field sensor 20 along the Z-axis direction) and the middle diagram of FIG. 2D (the second magnetic field measurement component diagram measured by the second magnetic field sensor 21 along the Z-axis direction), it is obviously that only using a single magnetic field sensor for detecting, the conventional technology is unable to determine whether the source of the variation of magnetic field belongs to the long distance magnetic field variation or the short distance magnetic field variation. From the result of calculation by the near magnetic field variation detection method of the present invention (as shown in the difference of the magnetic field measurement component diagram of the lower diagram of FIG. 2D), the near magnetic field variation only occurred two times, one during the T4 time period and the T5 time period, the other during the T8 time period. During the T5 time period, the result is affected by the passing of the vehicle 51. Hence, the near magnetic field variation detection method of the present invention can accurately exclude the interference of the long distance magnetic field variation, so as to determine the short distance magnetic field variation (the near magnetic field variation) and determine whether there is a car parking in the parking grid.

In addition, in the above-described embodiment, in the Step A2, the magnetic field measurement difference can be calculated by a magnitude of a difference of a first magnetic field measurement (vector) measured by the first magnetic field sensor 20 and a second magnetic field measurement (vector) measured by the second magnetic field sensor 21.

In some embodiments, the magnetic field sensor set 2 is configured in the detecting module 11, wherein the detecting module 11 (magnetic field sensor set 2) is disposed in the detecting area 30 or the peripheral area 40 of the detecting area 30, wherein the data processing unit 10 is not configured in the detecting module 11. The data processing unit 10 is connected to the magnetic field sensor set 2 in a wired or wireless manner. In some embodiments, the magnetic field sensor set 2 is connected to the data processing unit 10 by wireless communication.

In some embodiments, the first distance between the first magnetic field sensor 20 and the detecting area 30 is unequal to the second distance between the second magnetic field sensor 21 and detecting area 30. In some embodiments, the first distance between the first magnetic field sensor 20 and the detecting area 30 is greater than or equal to the sensor relative distance between the first magnetic field sensor 20 and the second magnetic field sensor 21. In some embodiments, the second distance between the second magnetic field sensor 21 and detecting area 30 is greater than or equal to the sensor relative distance.

In some embodiments, the direction of the line determined by the first magnetic field sensor 20 and the second magnetic field sensor 21 is approximately pointing to the detecting area 30.

Figure 3A:
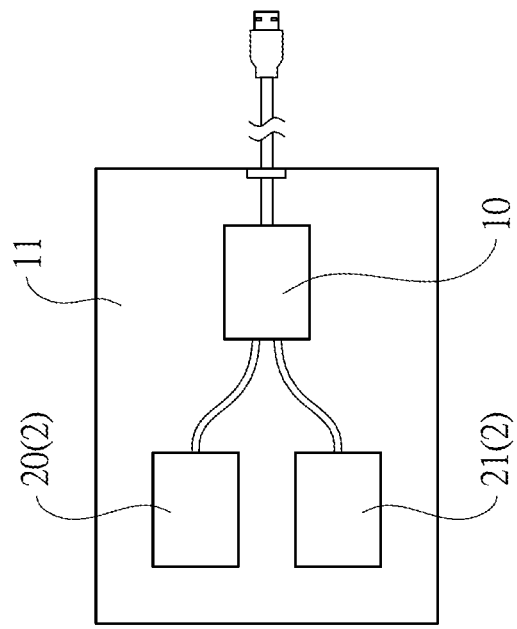
FIGS. 3A-3D are cross-sectional schematic views of embodiments of a near magnetic field variation detection system of the present invention.
Figure 3B:
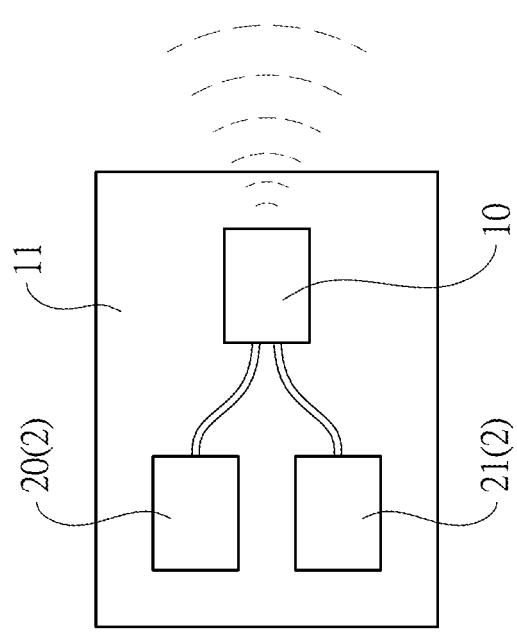
Figure 3D:
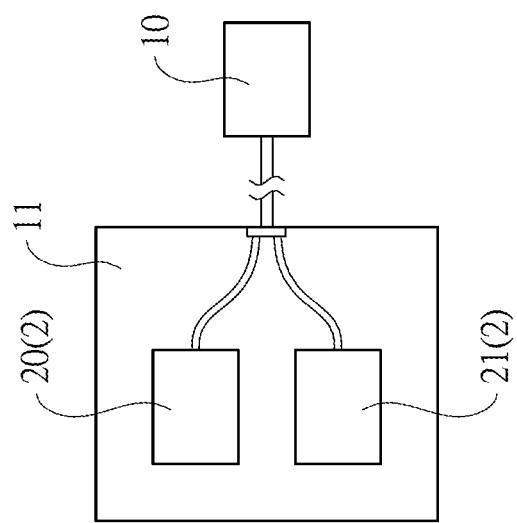
Figure 3C:
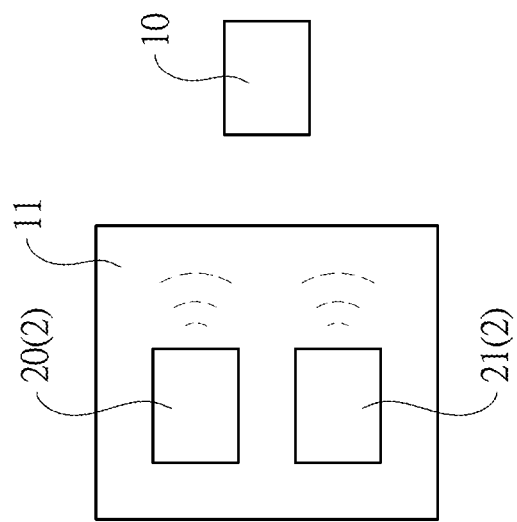

Please refer to FIGS. 3A-3D, which are cross-sectional schematic views of embodiments of a near magnetic field variation detection system of the present invention. In the embodiment of FIG. 3A, the data processing unit 10 and the magnetic field sensor set 2 (including the first magnetic field sensor 20 and the second magnetic field sensor 21) are configured in the detecting module 11. The first magnetic field sensor 20 and the second magnetic field sensor 21 are respectively connected to the data processing unit 10. The data processing unit 10 has the wireless transmission function so that the data measured by the first magnetic field sensor 20 and the second magnetic field sensor 21 or the result calculated by the data processing unit 10 (whether a near magnetic field variation occurs) can be transmitted through wireless communication. In the embodiment of FIG. 3B, the data processing unit 10 and the magnetic field sensor set 2 are configured in the detecting module 11. The first magnetic field sensor 20 and the second magnetic field sensor 21 are respectively connected to the data processing unit 10. The data measured by the first magnetic field sensor 20 and the second magnetic field sensor 21 or the result calculated by the data processing unit 10 (whether a near magnetic field variation occurs) can be transmitted in a wired manner. In the embodiment of FIG. 3C, the magnetic field sensor set 2 is configured in the detecting module 11. The data processing unit 10 is not configured in the detecting module 11. The first magnetic field sensor 20 and the second magnetic field sensor 21 have the wireless transmission function respectively so that the data measured by the first magnetic field sensor 20 and the second magnetic field sensor 21 can be respectively transmitted through wireless communication to the data processing unit 10. In the embodiment of FIG. 3D, the magnetic field sensor set 2 is configured in the detecting module 11. The data processing unit 10 is not configured in the detecting module 11. The magnetic field sensor set 2 (including the first magnetic field sensor 20 and the second magnetic field sensor 21) is connected to the data processing unit 10 so that the data measured by the first magnetic field sensor 20 and the second magnetic field sensor 21 can be transmitted to the data processing unit 10 in a wired manner.

Figure 4A:
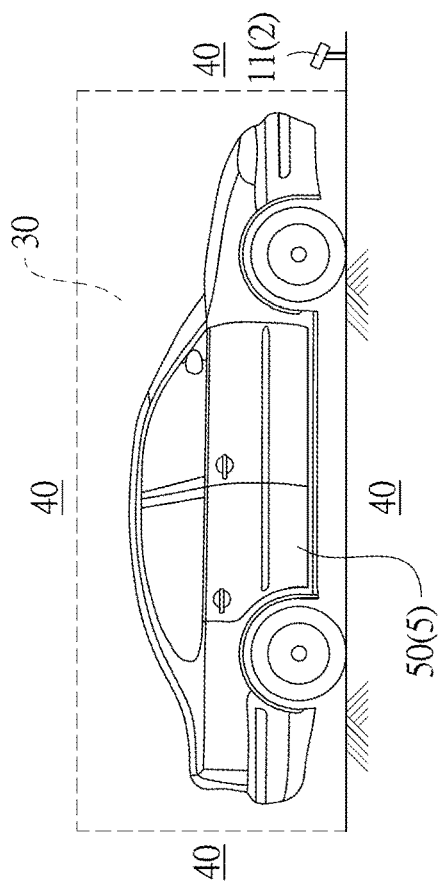
FIGS. 4A-4F are cross-sectional schematic views of embodiments of a near magnetic field variation detection system and detection method of the present invention.
Figure 4B:
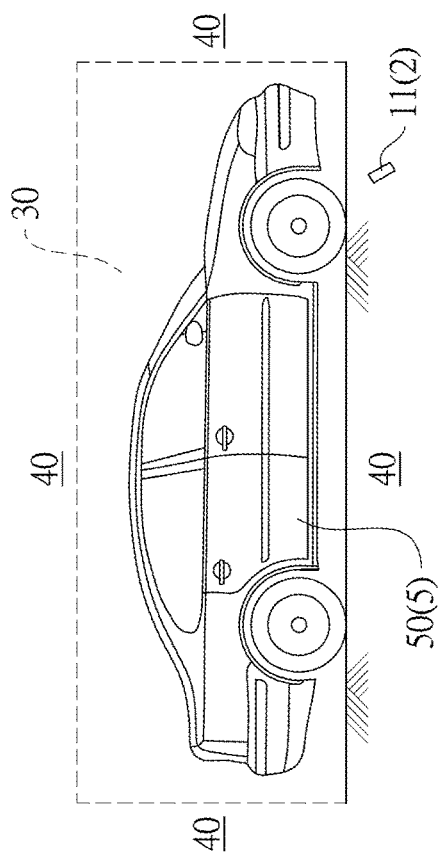
Figure 4D:
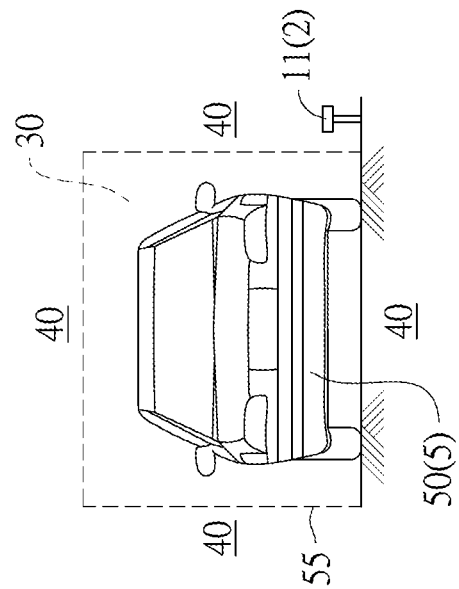
Figure 4C:
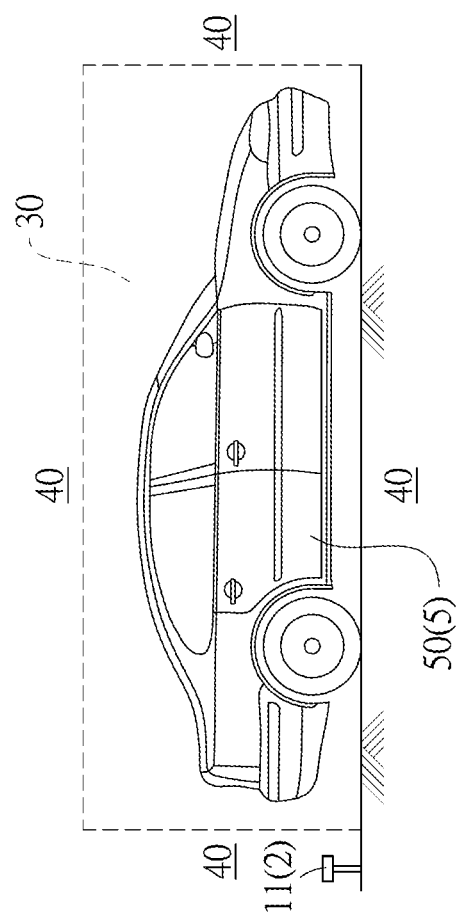
Figure 4F:
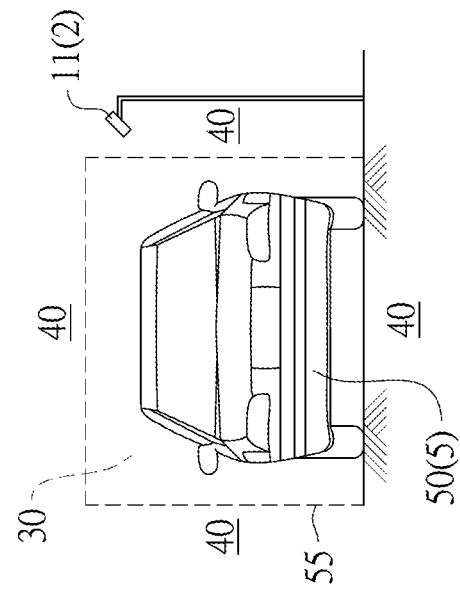
Figure 4E:
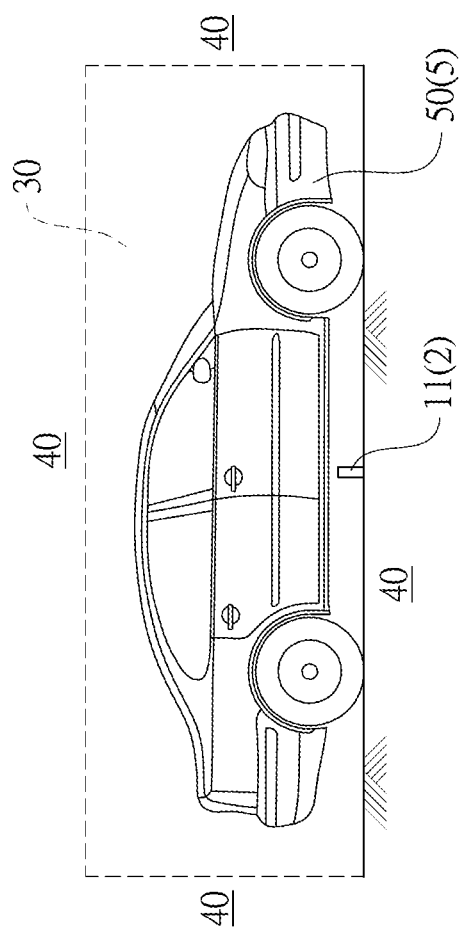

Please refer to FIGS. 4A-4F, which are cross-sectional schematic views of embodiments of a near magnetic field variation detection system and detection method of the present invention. In the embodiment of FIG. 4A, the detecting module 11 (including the magnetic field sensor set 2) is disposed under the ground (belonging to the peripheral area 40) of the detecting area 30 (parking grid), wherein the direction of the line determined by the first magnetic field sensor 20 and the second magnetic field sensor 21 is approximately pointing to the detecting area 30 (parking grid). In the embodiment of FIG. 4B, the detecting module 11 (including the magnetic field sensor set 2) is disposed above the ground (belonging to the peripheral area 40) on the back side of the detecting area 30 (parking grid), wherein the direction of the line determined by the first magnetic field sensor 20 and the second magnetic field sensor 21 is approximately pointing to the detecting area 30 (parking grid). In the embodiment of FIG. 4C, the detecting module 11 (including the magnetic field sensor set 2) is disposed above the ground (belonging to the peripheral area 40) on the front side of the detecting area 30 (parking grid), wherein the direction of the line determined by the first magnetic field sensor 20 and the second magnetic field sensor 21 is approximately pointing to the detecting area 30 (parking grid). In the embodiment of FIG. 4D, the detecting module 11 (including the magnetic field sensor set 2) is disposed above the ground (belonging to the peripheral area 40) on one side of the detecting area 30 (parking grid), wherein the direction of the line determined by the first magnetic field sensor 20 and the second magnetic field sensor 21 is approximately pointing to the detecting area 30 (parking grid). The detecting module 11 (including the magnetic field sensor set 2) is better not disposed near an entrance 55. In the embodiment of FIG. 4E, the detecting module 11 (including the magnetic field sensor set 2) is disposed above the ground (belonging to the detecting area 30) of the detecting area 30 (parking grid), wherein the direction of the line determined by the first magnetic field sensor 20 and the second magnetic field sensor 21 is approximately pointing to the detecting area 30 (parking grid). In the embodiment of FIG. 4F, the detecting module 11 (including the magnetic field sensor set 2) is disposed on the top of one side (belonging to the peripheral area 40) of the detecting area 30 (parking grid), wherein the direction of the line determined by the first magnetic field sensor 20 and the second magnetic field sensor 21 is approximately pointing to the detecting area 30 (parking grid). The detecting module 11 (including the magnetic field sensor set 2) is better not disposed near the entrance 55.

In some embodiments, the detecting area 30 is a parking grid. The parking grid has an entrance. The magnetic field sensor set 2 can be disposed at any position of the above, the under, or the surrounding of the parking grid, but not near the entrance. In some embodiments, the magnetic field sensor set 2 is not disposed between two adjacent parking grids.

Figure 5B:
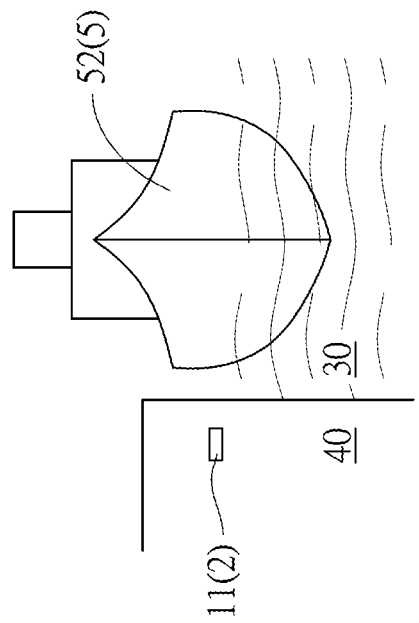
FIGS. 5A and 5B are cross-sectional schematic views of embodiments of a near magnetic field variation detection system and detection method of the present invention.
Figure 5A:
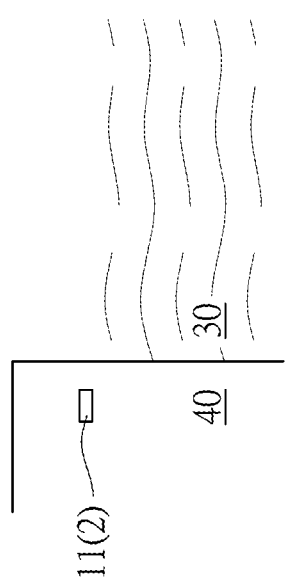

Please refer to FIGS. 5A and 5B, which are cross-sectional schematic views of embodiments of a near magnetic field variation detection system and detection method of the present invention. In current embodiment, the detecting area 30 is a dock. The peripheral area 40 is the side wall of the dock. The object 5 is a ship 52. The detecting module 11 (including the magnetic field sensor set 2) is disposed in the side wall of the dock (the peripheral area 40). By the near magnetic field variation detection method of the present invention, it can detect whether the ship enters the dock (the detecting area 30) and stopped there.

Therefore, by detecting the near magnetic field variation, the near magnetic field variation detection method of the present invention can detect whether a moveable apparatus (the object) is parked in a moveable apparatus parking place (the detecting area). The moveable apparatus (the object) can be a transportation vehicle, wherein the transportation vehicle is a land vehicle, a sea vehicle, a flight vehicle, a tram, a cable car, or a railed vehicle. In some embodiments, the moveable apparatus parking place (the detecting area) has a moveable apparatus entrance, and the detecting module (including the magnetic field sensor set) is preferably disposed in the position non-adjacent to the moveable apparatus entrance.

Figure 6B:
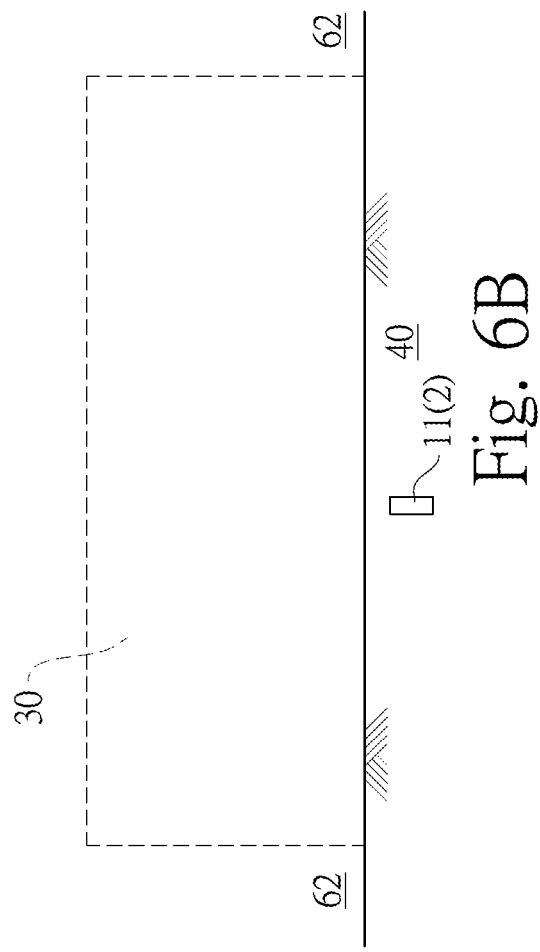
FIGS. 6B and 6C are cross-sectional schematic views of embodiments of a near magnetic field variation detection system and detection method of the present invention.
Figure 6C:
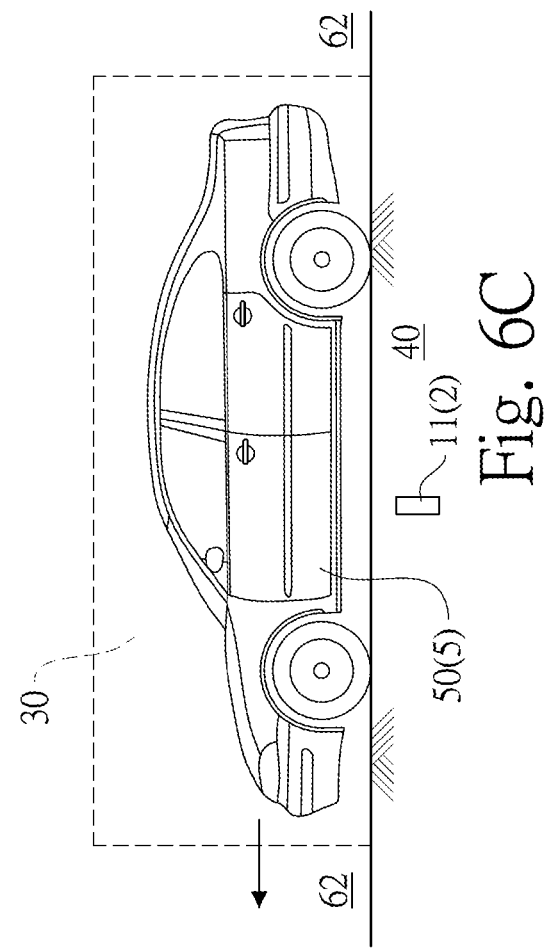
Figure 6A:
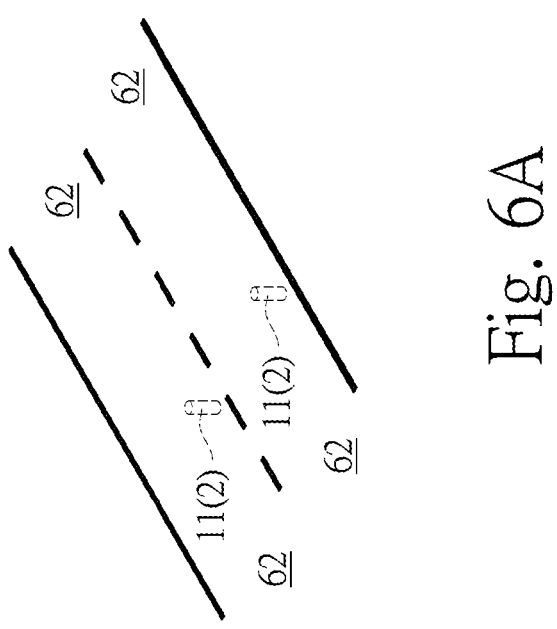
FIG. 6A is a schematic perspective view showing an embodiment of a near magnetic field variation detection system and detection method of the present invention.

Please refer to FIG. 6A, which is a schematic perspective view showing an embodiment of a near magnetic field variation detection system and detection method of the present invention. Please also refer to FIGS. 6B and 6C, which are cross-sectional schematic views of embodiments of a near magnetic field variation detection method of the present invention. The detecting module 11 (including the magnetic field sensor set 2) is disposed under the ground (the peripheral area 40) of an interval of a vehicle running route (the detecting area 30). When the vehicle 50 (the object 5) is in a third peripheral region 62, the near magnetic field variation detection method of the present invention does not detect the occurrence of a near magnetic field variation. When the vehicle 50 enters the interval of the vehicle running route (the detecting area 30), by detecting the near magnetic field variation, the near magnetic field variation detection method of the present invention can detect whether the vehicle 50 (the object 5) enters the interval of the vehicle running route (the detecting area 30). By calculating a number of times of the near magnetic field variation occurred, a traffic flow within the interval of the vehicle running route (the detecting area 30) can be detected.

Therefore, by detecting a number of times of the near magnetic field variation occurred, the near magnetic field variation detection method of the present invention can detect a traffic flow within the interval of the vehicle running route (the detecting area), wherein the object is a transportation vehicle.

Please refer to FIG. 7, which is a cross-sectional schematic view of an embodiment of a near magnetic field variation detection method of the present invention. A pumping motor 70 is disposed in a well 7 (the detecting area 30). The detecting module 11 (including the magnetic field sensor set 2) is disposed next to (belonging to the detecting area 30) the pumping motor 70. By detecting the near magnetic field variation, the near magnetic field variation detection method of the present invention can detect whether the pumping motor 70 starts (or stops) operating. The current embodiment belongs to the second type: the near magnetic field variation is caused as a motor starts (or stops) operating in the detecting area 30.

Therefore, by detecting the near magnetic field variation, the near magnetic field variation detection method of the present invention can detect whether a motor is starting operating in the detecting area, wherein the detecting area can be a well, an exploratory well or an oil well.

As disclosed in the above description and attached drawings, the present invention can provide a near magnetic field variation detection system and detection method thereof. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A near magnetic field variation detection method, wherein a magnetic field sensor set is disposed in a detecting area or a peripheral area of said detecting area, said magnetic field sensor set includes a first magnetic field sensor and a second magnetic field sensor, said method comprises following steps of:

measuring magnetic field by said first magnetic field sensor and said second magnetic field sensor respectively; and calculating a magnetic field measurement difference, wherein said magnetic field measurement difference is (1) a magnitude of a difference of a first magnetic field measurement measured by said first magnetic field sensor and a second magnetic field measurement measured by said second magnetic field sensor, or (2) a magnitude of a difference of a first magnetic field measurement component measured by said first magnetic field sensor along a characteristic direction and a second magnetic field measurement component measured by said second magnetic field sensor along said characteristic direction; wherein a near magnetic field variation is occurred when (a) said magnetic field measurement difference is continuously greater than a characteristic threshold within a characteristic time period, or (b) an average value of said magnetic field measurement difference is greater than a characteristic average threshold within a characteristic average time period; wherein said near magnetic field variation is caused as an object enters said detecting area.

2. The near magnetic field variation detection method according to claim 1, wherein said detecting area is an interval of a vehicle running route, said object is a transportation vehicle, wherein by detecting a number of times said near magnetic field variation occurred to determine a traffic flow within said interval of said vehicle running route.

3. The near magnetic field variation detection method according to claim 1, wherein said near magnetic field variation is caused as a pumping motor starts or stops operating in said detecting area.

4. The near magnetic field variation detection method according to claim 3, wherein said detecting area is a well, an exploratory well or an oil well.

5. A near magnetic field variation detection method, wherein a magnetic field sensor set is disposed in a detecting area or a peripheral area of said detecting area, said detecting area is a moveable apparatus parking place, said magnetic field sensor set includes a first magnetic field sensor and a second magnetic field sensor, said method comprises following steps of:

measuring magnetic field by said first magnetic field sensor and said second magnetic field sensor respectively; and calculating a magnetic field measurement difference, wherein said magnetic field measurement difference is (1) a magnitude of a difference of a first magnetic field measurement measured by said first magnetic field sensor and a second magnetic field measurement measured by said second magnetic field sensor, or (2) a magnitude of a difference of a first magnetic field measurement component measured by said first magnetic field sensor along a characteristic direction and a second magnetic field measurement component measured by said second magnetic field sensor along said characteristic direction; wherein a near magnetic field variation is occurred when (a) said magnetic field measurement difference is continuously greater than a characteristic threshold within a characteristic time period, or (b) an average value of said magnetic field measurement difference is greater than a characteristic average threshold within a characteristic average time period, wherein said near magnetic field variation is caused as an object enters said detecting area, said object is a moveable apparatus, wherein by detecting said near magnetic field variation to determine whether said moveable apparatus is parked in said moveable apparatus parking place.

6. The near magnetic field variation detection method according to claim 5, wherein said moveable apparatus is a transportation vehicle, wherein said transportation vehicle is a land vehicle, a sea vehicle, a flight vehicle, a tram, a cable car, or a railed vehicle.

7. The near magnetic field variation detection method according to claim 5, wherein said moveable apparatus parking place has a moveable apparatus entrance, wherein said magnetic field sensor set is disposed non-adjacent to said moveable apparatus entrance.

8. The near magnetic field variation detection method according to claim 5, wherein said object includes at least one metallic material.

9. The near magnetic field variation detection method according to claim 5, wherein said peripheral area includes the above, the under, and the surrounding of said detecting area.

10. The near magnetic field variation detection method according to claim 5, wherein said characteristic direction is approximately pointing to said detecting area.

11. The near magnetic field variation detection method according to claim 5, wherein said characteristic direction is approximately parallel to a geomagnetic inclination direction of the location of said detecting area.

12. The near magnetic field variation detection method according to claim 5, wherein said characteristic direction is approximately parallel to a geomagnetic declination direction of the location of said detecting area.

13. The near magnetic field variation detection method according to claim 5, wherein a first distance between said first magnetic field sensor and said detecting area is not equal to a second distance between said second magnetic field sensor and said detecting area.

14. The near magnetic field variation detection method according to claim 5, wherein a first distance between said first magnetic field sensor and said detecting area is greater than or equal to a sensor relative distance between said first magnetic field sensor and said second magnetic field sensor.

15. The near magnetic field variation detection method according to claim 14, wherein a second distance between said second magnetic field sensor and said detecting area is greater than or equal to said sensor relative distance.

16. The near magnetic field variation detection method according to claim 15, wherein said first distance is not equal to said second distance.

17. The near magnetic field variation detection method according to claim 5, wherein a direction of a line determined by said first magnetic field sensor and said second magnetic field sensor is approximately parallel to said characteristic direction.

18. The near magnetic field variation detection method according to claim 5, wherein a direction of a line determined by said first magnetic field sensor and said second magnetic field sensor is approximately pointing to said detecting area.

19. A near magnetic field variation detection system comprising:
a magnetic field sensor set disposed in a detecting area or a peripheral area of said detecting area, wherein said magnetic field sensor set comprises:
a first magnetic field sensor; and
a second magnetic field sensor; and
a data processing unit connected with said magnetic field sensor set by wire or wireless transmission, wherein a magnetic field measurement difference is calculated by said data processing unit, wherein said magnetic field measurement difference is (1) a magnitude of a difference of a first magnetic field measurement measured by said first magnetic field sensor and a second magnetic field measurement measured by said second magnetic field sensor, or (2) a magnitude of a difference of a first magnetic field measurement component measured by said first magnetic field sensor along a characteristic direction and a second magnetic field measurement component measured by said second magnetic field sensor along said characteristic direction; wherein a near magnetic field variation is occurred when (a) said magnetic field measurement difference is continuously greater than a characteristic threshold within a characteristic time period, or (b) an average value of said magnetic field measurement difference is greater than a characteristic average threshold within a characteristic average time period wherein said near magnetic field variation is caused as an object enters said detecting area.

20. The near magnetic field variation detection system according to claim 19, wherein said detecting area is an interval of a vehicle running route, said object is a transportation vehicle, wherein by detecting a number of times said near magnetic field variation occurred to determine a traffic flow within said interval of said vehicle running route.

21. The near magnetic field variation detection system according to claim 19, wherein said near magnetic field variation is caused as a pumping motor starts or stops operating in said detecting area.

22. The near magnetic field variation detection system according to claim 21, wherein said detecting area is a well, an exploratory well or an oil well.

23. A near magnetic field variation detection system comprising:
a magnetic field sensor set disposed in a detecting area or a peripheral area of said detecting area, wherein said detecting area is a moveable apparatus parking place, wherein said magnetic field sensor set comprises:
a first magnetic field sensor; and
a second magnetic field sensor; and
a data processing unit connected with said magnetic field sensor set by wire or wireless transmission, wherein a magnetic field measurement difference is calculated by said data processing unit, wherein said magnetic field measurement difference is (1) a magnitude of a difference of a first magnetic field measurement measured by said first magnetic field sensor and a second magnetic field measurement measured by said second magnetic field sensor, or (2) a magnitude of a difference of a first magnetic field measurement component measured by said first magnetic field sensor along a characteristic direction and a second magnetic field measurement component measured by said second magnetic field sensor along said characteristic direction; wherein a near magnetic field variation is occurred when (a) said magnetic field measurement difference is continuously greater than a characteristic threshold within a characteristic time period, or (b) an average value of said magnetic field measurement difference is greater than a characteristic average threshold within a characteristic average time period, wherein said near magnetic field variation is caused as an object enters said detecting area, said object is a moveable apparatus, wherein by detecting said near magnetic field variation to determine if said moveable apparatus is parked in said moveable apparatus parking place.

24. The near magnetic field variation detection system according to claim 23, wherein said moveable apparatus is a transportation vehicle, wherein said transportation vehicle is a land vehicle, a sea vehicle, a flight vehicle, a tram, a cable car, or a railed vehicle.

25. The near magnetic field variation detection system according to claim 23, wherein said moveable apparatus parking place has a moveable apparatus entrance, wherein said magnetic field sensor set is disposed non-adjacent to said moveable apparatus entrance.

26. The near magnetic field variation detection system according to claim 23, wherein said object includes at least one metallic material.

27. The near magnetic field variation detection system according to claim 23, wherein said peripheral area includes the above, the under, and the surrounding of said detecting area.

28. The near magnetic field variation detection system according to claim 23, wherein said characteristic direction is approximately pointing to said detecting area.

29. The near magnetic field variation detection system according to claim 23, wherein said characteristic direction is approximately parallel to a geomagnetic inclination direction of the location of said detecting area.

30. The near magnetic field variation detection system according to claim 23, wherein said characteristic direction is approximately parallel to a geomagnetic declination direction of the location of said detecting area.

31. The near magnetic field variation detection system according to claim 23, wherein a first distance between said first magnetic field sensor and said detecting area is not equal to a second distance between said second magnetic field sensor and said detecting area.

32. The near magnetic field variation detection system according to claim 23, wherein a first distance between said first magnetic field sensor and said detecting area is greater than or equal to a sensor relative distance between said first magnetic field sensor and said second magnetic field sensor.

33. The near magnetic field variation detection system according to claim 32, wherein a second distance between said second magnetic field sensor and said detecting area is greater than or equal to said sensor relative distance.

34. The near magnetic field variation detection system according to claim 33, wherein said first distance is not equal to said second distance.

35. The near magnetic field variation detection system according to claim 23, wherein a direction of a line determined by said first magnetic field sensor and said second magnetic field sensor is approximately parallel to said characteristic direction.

36. The near magnetic field variation detection system according to claim 23, wherein a direction of a line determined by said first magnetic field sensor and said second magnetic field sensor is approximately pointing to said detecting area.

* * * * *